United States Patent
Higuchi et al.

(10) Patent No.: US 9,324,729 B2
(45) Date of Patent: Apr. 26, 2016

(54) NON-VOLATILE MEMORY DEVICE HAVING A MULTILAYER BLOCK INSULATING FILM TO SUPPRESS GATE LEAKAGE CURRENT

(71) Applicant: Kabushiki Kaisha Toshiba, Minato-ku (JP)

(72) Inventors: Masaaki Higuchi, Yokkaichi (JP); Katsuyuki Sekine, Yokkaichi (JP); Makoto Fujiwara, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/483,546

(22) Filed: Sep. 11, 2014

(65) Prior Publication Data
US 2015/0372002 A1 Dec. 24, 2015

Related U.S. Application Data

(60) Provisional application No. 62/016,333, filed on Jun. 24, 2014.

(51) Int. Cl.
*H01L 29/792* (2006.01)
*H01L 27/115* (2006.01)

(52) U.S. Cl.
CPC .................. *H01L 27/11582* (2013.01)

(58) Field of Classification Search
CPC ............ H01L 51/0072; H01L 21/5056; H01L 51/5072; H01L 51/0067; H01L 51/5016
USPC .................. 257/316, 324, E21.423, E29.309
See application file for complete search history.

(56) References Cited

U.S. PATENT DOCUMENTS

| | | | |
|---|---|---|---|
| 8,338,244 B2 | 12/2012 | Son et al. | |
| 8,338,876 B2 | 12/2012 | Kito et al. | |
| 8,994,091 B2* | 3/2015 | Lee | H01L 27/11556 257/316 |
| 2010/0213537 A1* | 8/2010 | Fukuzumi | H01L 27/11578 257/326 |
| 2011/0147824 A1* | 6/2011 | Son | G11C 16/0483 6/483 |
| 2012/0132981 A1 | 5/2012 | Imamura et al. | |
| 2012/0241843 A1* | 9/2012 | Iino | H01L 21/76801 257/324 |
| 2013/0200450 A1* | 8/2013 | Kusai | H01L 29/66833 257/324 |
| 2014/0070302 A1* | 3/2014 | Yoo | H01L 27/1157 257/324 |

FOREIGN PATENT DOCUMENTS

| | | |
|---|---|---|
| JP | 2010-147125 A | 7/2010 |
| JP | 2012-119445 A | 6/2012 |

* cited by examiner

*Primary Examiner* — Andy Huynh
(74) *Attorney, Agent, or Firm* — Oblon, McClelland, Maier & Neustadt, L.L.P

(57) ABSTRACT

According to one embodiment, a non-volatile memory device includes electrodes, one semiconductor layer, conductive layers, and first and second insulating films. The electrodes are arranged side by side in a first direction. The semiconductor layer extends into the electrodes in the first direction. The conductive layers are provided between each electrode and the semiconductor layer and separated from each other in the first direction. The first insulating film extends between the conductive layers and the semiconductor layer in the first direction. The second insulating film is provided between each electrode and the conductive layers. The conductive layers become smaller in a thickness as the conductive layers are closer to an end in the first direction or a direction opposite to the first direction. The second insulating film includes a first film contacting the conductive layers, and a second film provided between each electrode and the first film.

16 Claims, 15 Drawing Sheets

US 9,324,729 B2

NON-VOLATILE MEMORY DEVICE HAVING A MULTILAYER BLOCK INSULATING FILM TO SUPPRESS GATE LEAKAGE CURRENT

CROSS-REFERENCE TO RELATED APPLICATIONS

This application is based upon and claims the benefit of priority from U.S. Provisional Patent Application 62/016,333, filed on Jun. 24, 2014; the entire contents of which are incorporated herein by reference.

FIELD

Embodiments described herein relate generally to a non-volatile memory device.

BACKGROUND

In order to realize a next-generation non-volatile memory device, the development of a memory cell array having a three-dimensional structure has been progressing. The memory cell array having a three-dimensional structure includes a plurality of word lines stacked and memory cells formed inside a memory hole passing through the word lines. In such a non-volatile memory device, an improvement in the reliability of the memory cell is required.

DETAILED DESCRIPTION

Figure 1:
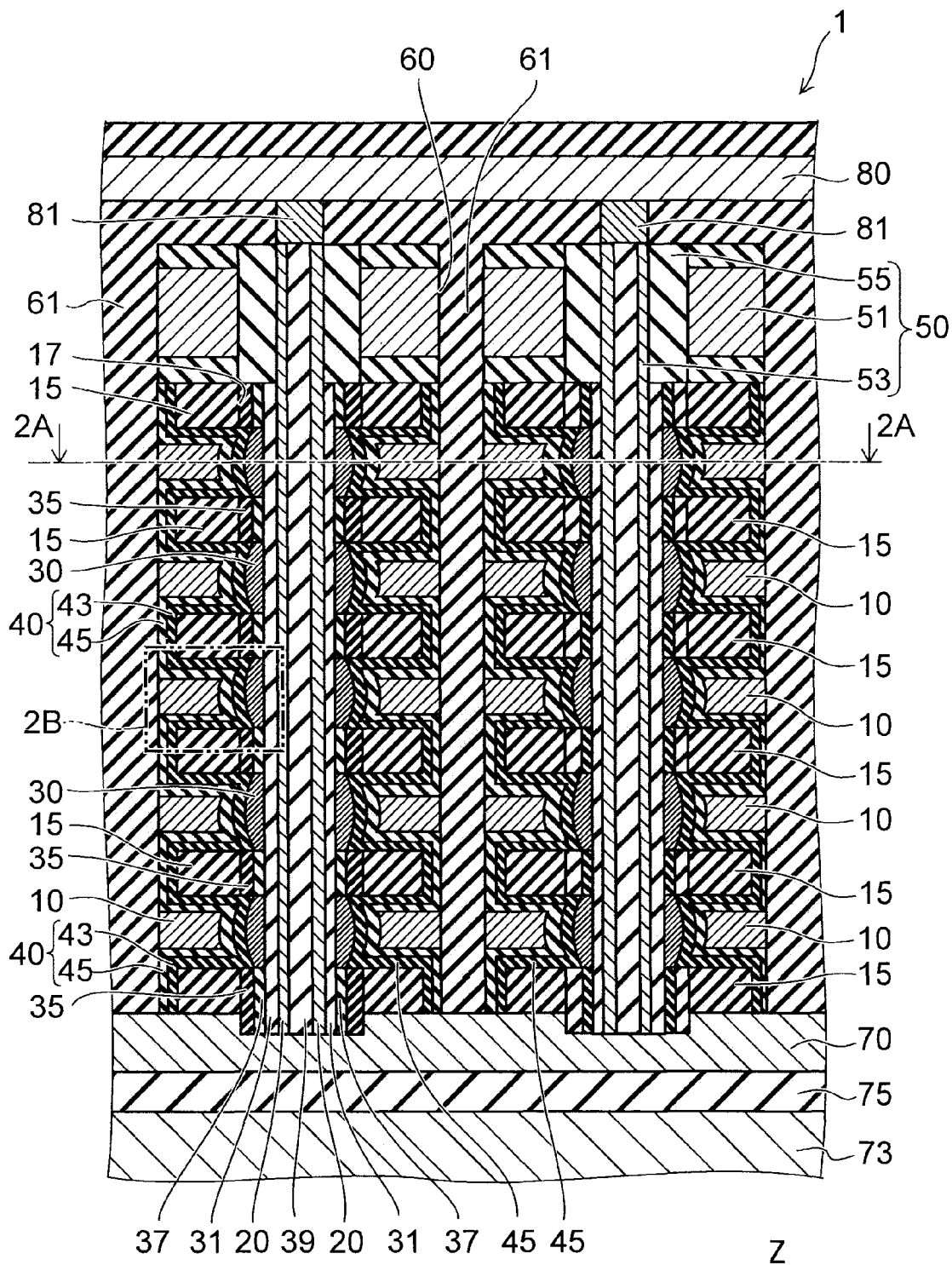
FIG. 1 is a schematic cross-sectional view illustrating a non-volatile memory device according to a first embodiment.

According to one embodiment, a non-volatile memory device includes a plurality of electrodes, at least one semiconductor layer, conductive layers, a first insulating film, and a second insulating film. The electrodes are arranged side by side in a first direction. At least one semiconductor layer extends into the electrodes in the first direction. The conductive layers are provided between each of the electrodes and the semiconductor layer. The conductive layers are separated from each other in the first direction. The first insulating film extends between the conductive layers and the semiconductor layer in the first direction along the semiconductor layer. The second insulating film is provided between each of the electrodes and the conductive layers. The conductive layers become smaller in a thickness in a direction perpendicular to the first direction as the conductive layers are closer to an end in the first direction or a direction opposite to the first direction, and have a convex shape in a direction from the semiconductor layer toward each of the electrodes. The second insulating film includes a first film in contact with the conductive layers, and a second film provided between each of the electrodes and the first film. A dielectric constant of the first film is higher than a dielectric constant of the second film.

Various embodiments will be described hereinafter with reference to the accompanying drawings. The same portions in the drawings are denoted by the same reference numerals and signs, and thus the detailed description thereof will be appropriately omitted, and different portions will be described. Meanwhile, the drawings are schematic or conceptual, a relationship between the thickness and the width of each portion, a size ratio between the components, and the like are not necessarily identical to those in reality. Even when the same portions are shown, mutual dimensions or ratios may be shown differently in the drawings. The arrangement of each element may be described using XYZ-axis directions shown in the drawings. The X-axis, the Y-axis, and the Z-axis are orthogonal to each other, a Z-axis direction may be represented as an upward direction, and a direction opposite thereto may be represented as a downward direction.

First Embodiment

FIG. 1 is a schematic cross-sectional view illustrating a non-volatile memory device 1 according to a first embodiment. The non-volatile memory device 1 shown in FIG. 1 is one example, and the embodiment is not limited thereto.

The non-volatile memory device 1 includes, for example, a plurality of electrodes (hereinafter, control gate 10) arranged side by side in a first direction (hereinafter, Z-direction) perpendicular to a substrate, and at least one semiconductor layer (hereinafter, channel body 20). The channel body 20 extends into a plurality of control gates 10 in the Z-direction.

The control gates 10 are arranged side by side in the Z-direction through, for example, interlayer insulating films 15. The control gates 10 and the interlayer insulating films 15 are alternately arranged in the Z-direction. The channel body 20 is provided inside, for example, a memory hole 17 passing through the control gate 10 and the interlayer insulating film 15 in the Z-direction.

The non-volatile memory device 1 includes a conductive layer 30, a first insulating film 31, and a second insulating film 40 between each of the plurality of control gates 10 and the channel body 20. The conductive layer 30 is provided between each control gate 10 and the first insulating film 31. The conductive layers 30 are provided so as to be separated from each other in the Z-direction.

The first insulating film 31 extends between the channel body 20 and the conductive layer 30 in the Z-direction along the channel body 20. The first insulating film 31 is in contact with, for example, the conductive layer 30. The second insulating film 40 is provided between each control gate 10 and the conductive layer 30.

Figure 2A:
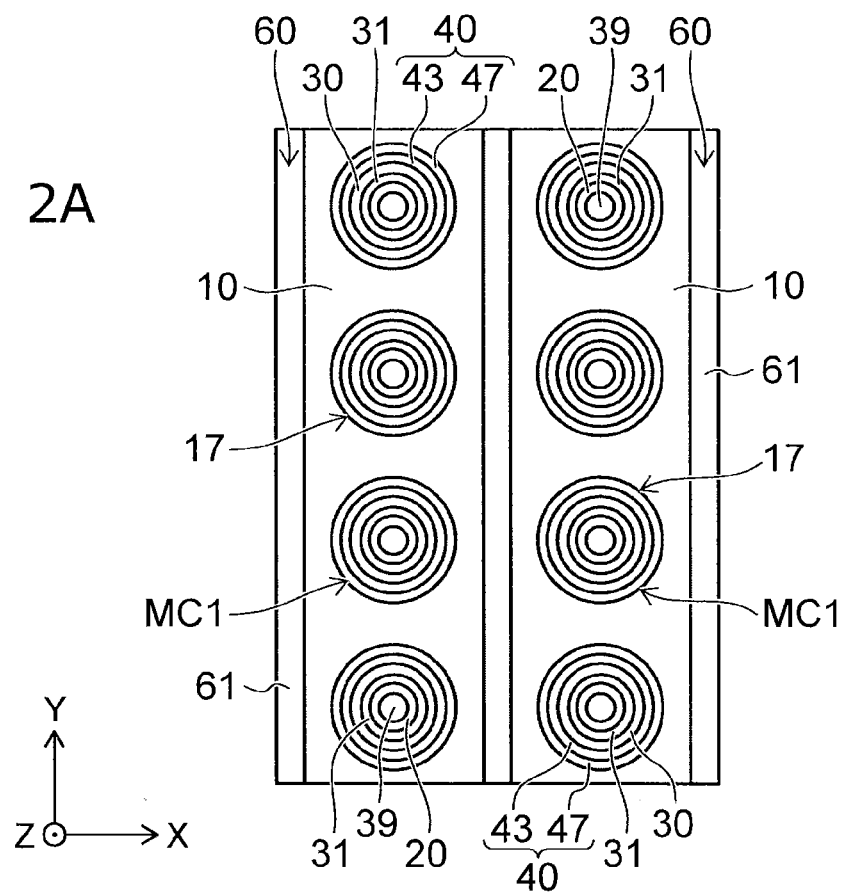
FIGS. 2A and 2B are other schematic views illustrating the non-volatile memory device according to the first embodiment.
Figure 2B:
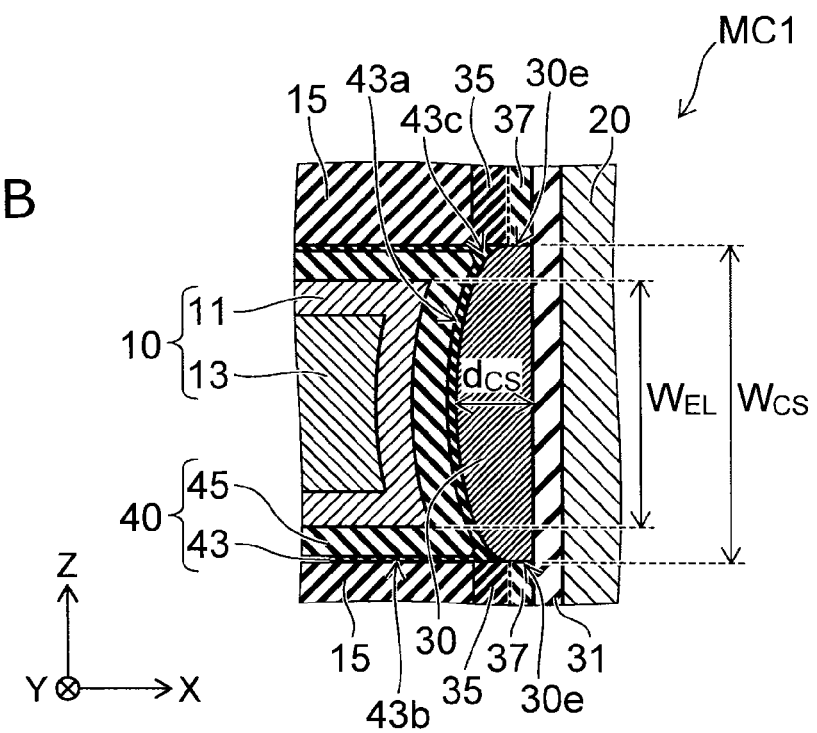

Next, the non-volatile memory device 1 will be described in detail with reference to FIG. 1 to FIG. 2B. FIGS. 2A and 2B are other schematic views illustrating the non-volatile memory device 1 according to the first embodiment. FIG. 2A is a cross-sectional view taken along line 2A-2A shown in FIG. 1. FIG. 2B is a partially enlarged cross-sectional view illustrating a region 2B shown in FIG. 1, and shows a structure of a memory cell MC1.

As shown in FIG. 1, the plurality of control gates 10 are provided on a source interconnection 70. The source interconnection 70 is provided on, for example, a substrate 73 with an interlayer insulating film 75 interposed therebetween. The memory hole 17 is in communication with the source interconnection 70. The channel body 20 extends in the Z-direction along the inner wall of the memory hole 17. The channel body 20 is electrically connected to the source interconnection 70 at the bottom of the memory hole 17.

A selection transistor 50 is provided on the uppermost layer of the plurality of control gates 10 in the Z-direction. The selection transistor 50 includes a selection gate 51, a channel body 53, and a gate insulating film 55. The channel body 53 is electrically connected to the channel body 20. The gate insulating film 55 is provided between the selection gate 51 and the channel body 53.

Further, a bit line 80 is provided on the selection transistor 50. The bit line 80 is electrically connected to the channel body 53 through a contact plug 81. The bit line 80 is electrically connected to the channel body 20 through the selection transistor 50.

The bit line 80 extends, for example, in the X-direction. The bit line 80 is electrically connected to a plurality of channel bodies 20 arranged side by side in the X-direction. The selection transistor 50 selects one of the plurality of channel bodies 20 which are electrically connected to one bit line 80. That is, the selection transistor 50 provided on one channel body 20 is set to be in an on state, and the selection transistor 50 provided on another channel body 20 is set to be in an off state, to thereby select one channel body 20.

As shown in FIG. 2A, the control gate 10 extends in the Y-direction. The plurality of control gates 10 are arranged side by side in the X-direction. An insulating film 61 is provided between the control gates 10 next to each other. The insulating film 61 is provided inside a slit 60 which is provided between the control gates 10 next to each other.

The slit 60 is, for example, a groove having a depth from the selection gate 51 to the source interconnection 70, and extends in the Y-direction. In this example, the slit 60 is formed for each memory hole 17 in the X-direction, but the embodiment is not limited thereto. For example, the slit 60 may be formed in for each of a plurality of memory holes arranged side by side in the X-direction. In other words, the control gate 10 may be formed so as to surround two or more memory holes which are respectively arranged side by side in the X-direction and the Y-direction.

As shown in FIG. 2A, one control gate 10 is provided with the plurality of memory holes 17. In this example, the plurality of memory holes 17 are formed so as to be lined up in a row in the Y-direction, but the embodiment is not limited to this example. The plurality of memory holes passing through one control gate 10 may be arranged, for example, in a matrix within the X-Y plane, and may be arranged in zigzag.

The cross-section of the memory hole 17 perpendicular to the Z-direction is, for example, circular. The memory hole 17 includes an insulating core 39, the channel body 20, the first insulating film 31, the conductive layer 30, and the second insulating film 40 in this order, from the center thereof. The second insulating film 40 includes a first film 43 and a second film 45.

The memory cell MC1 is formed between each control gate 10 and the channel body 20. The memory cell MC1 includes the first insulating film 31, the conductive layer 30, and the second insulating film 40 from the channel body 20 side. The first insulating film 31 functions as, for example, a tunnel insulating film. The conductive layer 30 serves as a charge storage layer (or, floating gate), for example. The second insulating film 40 functions as, for example, a block insulating film.

As shown in FIG. 2B, the second insulating film 40 is provided between the control gate 10 and the conductive layer 30. The second insulating film 40 includes the first film 43 and the second film 45.

The first film 43 includes a first portion 43a and a second portion 43b. The first portion 43a is located between the conductive layer 30 and the control gate 10. The second portion 43b extends between the control gate 10 and the interlayer insulating film 15 adjacent thereto. The first portion 43a is in contact with the conductive layer 30. The second film 45 is located between the control gate 10 and the first film 43. The dielectric constant of the first film 43 is higher than the dielectric constant of the second film 45.

The control gate 10 includes, for example, a first electrode layer (hereinafter, electrode layer 11) and a second electrode layer (hereinafter, electrode layer 13). The electrode layer 11 is, for example, a barrier metal layer, and prevents metal atoms contained in the electrode layer 13 from being diffused into the memory cell MC1.

The non-volatile memory device 1 further includes a third insulating film 35 and a fourth insulating film 37. The third insulating film 35 is located between the interlayer insulating film 15 and the fourth insulating film 37. The fourth insulating film 37 is provided between the first insulating film 31 and the third insulating film 35. As described later, the fourth insulating film 37 is, for example, an oxidized portion of a conductive film 130 serving as the conductive layer 30.

As shown in FIG. 2B, the conductive layer 30 becomes smaller in a thickness $d_{CS}$ in a direction perpendicular to the Z-direction as the conductive layer is closer to an end 30e in the Z-direction or a direction opposite thereto. In addition, the conductive layer 30 has a convex shape in a direction (for example, −X-direction) from the channel body 20 toward the control gate 10. Further, a width $W_{EL}$ of the control gate 10 in the Z-direction is smaller than a width $W_{CS}$ of the conductive layer 30 in the Z-direction.

The memory cell MC1 includes the conductive layer 30 provided in a convex shape toward the control gate 10. For this reason, for example, the control gate 10 becomes larger in area that is in contact with the block insulating film (second insulating film 40), as compared to a case where the memory cell includes a flat charge storage layer. Thereby, it is possible to increase capacitive coupling between the control gate 10 and the memory cell MC1, a so-called coupling ratio. In addition, in the conductive layer 30, it is also possible to store charge in a portion extending in the Z-direction further than the control gate 10. For this reason, in the memory cell MC1, it is possible to increase the amount of charge capable of being stored.

In addition, as shown in FIG. 2B, in the first film 43, the film thickness thereof becomes maximum at a corner portion between the first portion 43a and the second portion 43b. As described below, the first film 43 alleviates an electric field of a portion of the second insulating film 40 that is in contact with the conductive layer 30, and suppresses a gate leakage current. Therefore, in the embodiment, it is possible to further reduce an electric field of a portion that is in contact with the end 30e of the conductive layer 30.

For example, at the end of the conductive layer 30, the outside diameter thereof is small. For this reason, an electric field in the interface between the conductive layer 30 and the second insulating film 40 becomes higher at the end than at the central portion of the conductive layer 30. Therefore, it is possible to suppress a gate leakage current by increasing the film thickness of the portion of the first film 43 that is in contact with the end 30e of the conductive layer 30.

Figure 3A:
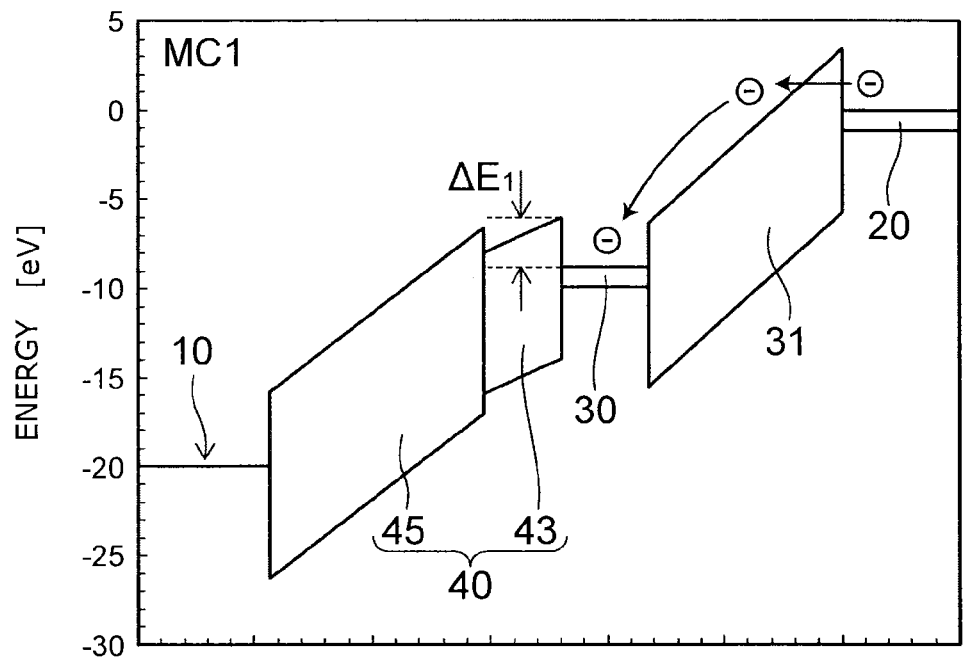
FIGS. 3A and 3B are band diagrams of the memory cells of the non-volatile memory device according to the first embodiment.
Figure 3B:
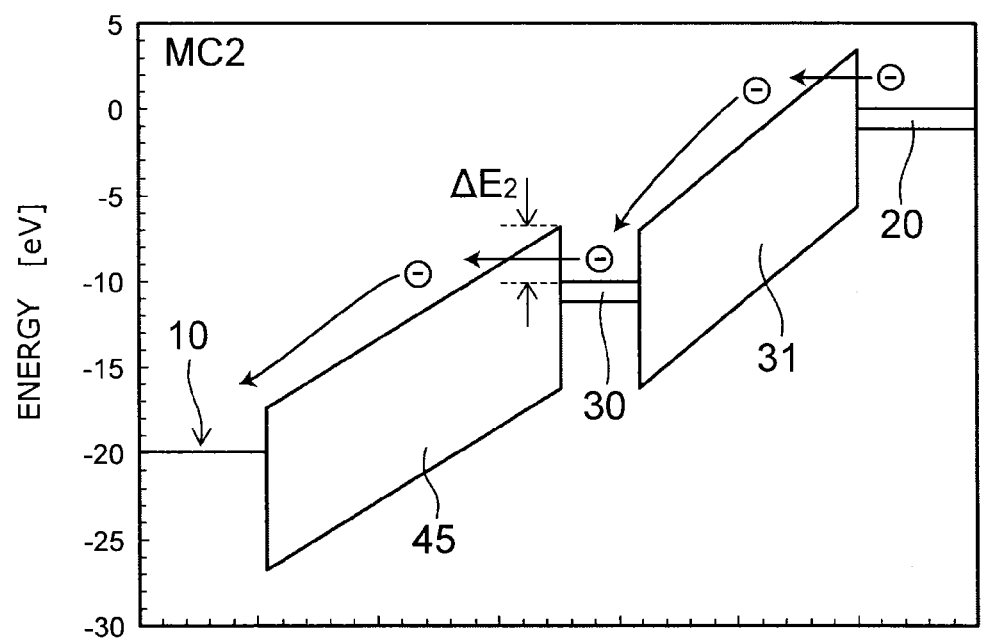

Next, operations of the non-volatile memory device 1 according to the first embodiment will be described with reference to FIGS. 3A and 3B. FIGS. 3A and 3B show data writing operations. FIGS. 3A and 3B are energy band diagrams of the memory cells.

FIG. 3A is a band diagram of the memory cell MC1 of the non-volatile memory device 1 according to the embodiment. FIG. 3B is a band diagram of the memory cell MC2 of a non-volatile memory device according to a comparative example. In each drawing, the control gate 10 is a metal, and the channel body 20 and the conductive layer 30 are semiconductors, for example, silicon.

As shown in FIGS. 3A and 3B, during data writing, a potential difference of, for example, 20V is given between the control gate 10 and the channel body 20. Thereby, an electric field occurs in the first insulating film 31, and electrons of the channel body 20 pass through the first insulating film 31 and are injected into the conductive layer 30. The conductive layer 30 forms a potential well surrounded by an energy barrier between the first insulating film 31 and the second insulating film 40, and the electrons injected into the conductive layer 30 are held in the potential well. That is, the conductive layer 30 functions as a charge storage layer.

In the memory cell MC1 shown in FIG. 3A, the second insulating film 40 which is a block insulating film includes the first film 43 and the second film 45. The first film 43 is in contact with the conductive layer 30, and the dielectric constant thereof is higher than the dielectric constant of the second film 45. Therefore, the first film 43 alleviates an electric field in the interface between the conductive layer 30 and the second insulating film 40. Therefore, for example, during data writing, it is possible to reduce the probability of electrons passing through an energy barrier $\Delta E_1$ between the conductive layer 30 and the first film 43, and to suppress the gate leakage current.

On the other hand, in the memory cell MC2 shown in FIG. 3B, the block insulating film does not include the first film 43, and is a single layer of the second film 45. Therefore, an electric field in the interface between the conductive layer 30 and the second film 45 is not alleviated, and becomes higher than in the example of FIG. 3A. For this reason, it is possible for electrons to pass through an energy barrier $\Delta E_2$ between the conductive layer 30 and the second film 45, and to transfer from the conductive layer 30 to the control gate 10. That is, a gate leakage current during data writing becomes larger in the memory cell MC2 than in the memory cell MC1.

In this manner, in the memory cell MC1 including the second film 43, it is possible to suppress a gate leakage current. In other words, in the memory cell MC1, the block insulating film is given with a high breakdown voltage, and thus the reliability thereof can be improved.

Next, a method of manufacturing the non-volatile memory device 1 according to the first embodiment will be described with reference to FIGS. 4A to 4L. FIGS. 4A to 4L are schematic cross-sectional views illustrating a process of manufacturing the non-volatile memory device 1.

Figure 4A:
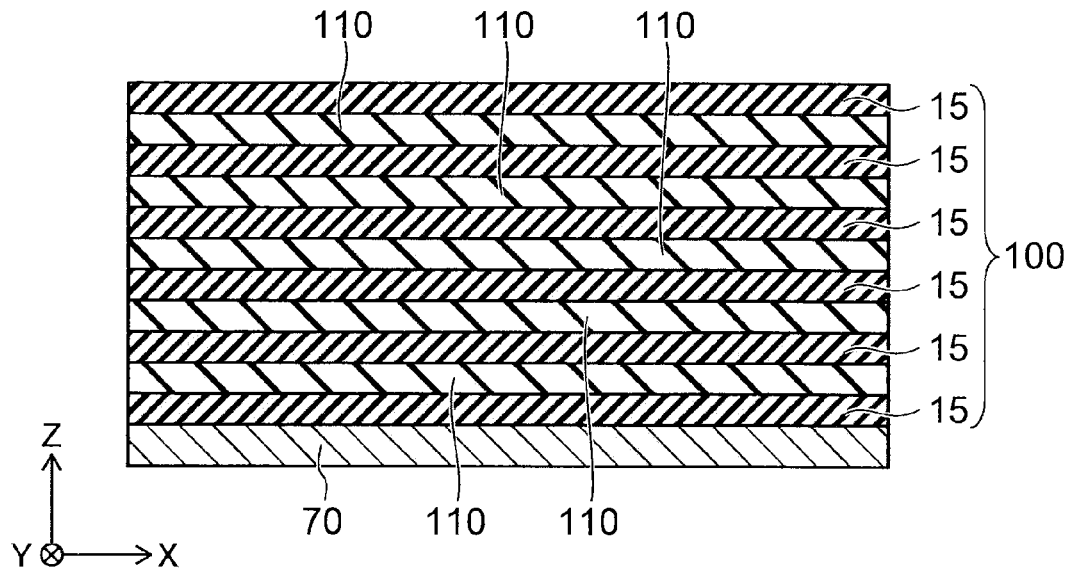
FIGS. 4A to 4L are schematic cross-sectional views illustrating a process of manufacturing the non-volatile memory device according to the first embodiment.

As shown in FIG. 4A, for example, the interlayer insulating film 15 and a sacrifice film 110 are alternately stacked on the source interconnection 70 in the Z-direction. Thereby, a stacked body 100 including a plurality of interlayer insulating films 15 and a plurality of sacrifice films 110 is formed.

The interlayer insulating film 15 is, for example, a silicon oxide film. The sacrifice film 110 is, for example, a silicon nitride film. The interlayer insulating film 15 and the sacrifice film 110 can be continuously formed using, for example, a CVD (Chemical Vapor Deposition) method.

Figure 4B:
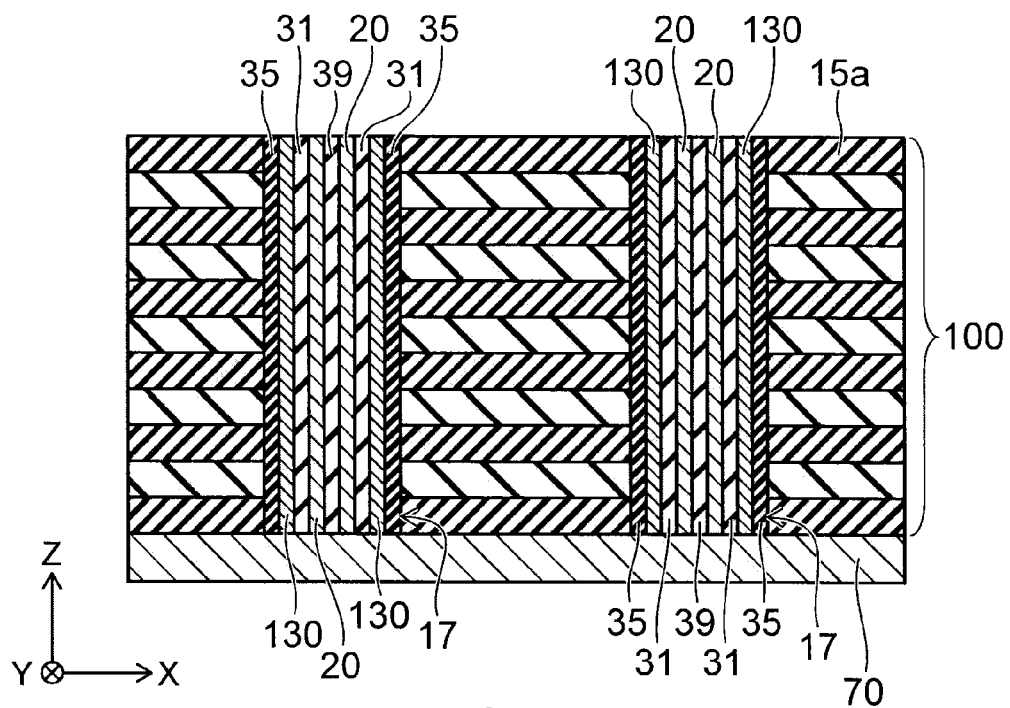

As shown in FIG. 4B, the memory hole 17 passing through the stacked body 100 in the Z-direction is formed. The channel body 20, the first insulating film 31, the first conductive film (hereinafter, conductive film 130), the third insulating film 35, and the core 39 are formed in the inside thereof.

For example, the memory hole 17 communicating from an interlayer insulating film 15a, which is an uppermost layer, of the plurality of interlayer insulating films 15 to the source interconnection 70 is formed. The memory hole 17 is formed by, for example, selectively etching the interlayer insulating film 15 and the sacrifice film 110 using RIE (Reactive Ion Etching).

The third insulating film 35, the conductive film 130 and the first insulating film 31 are formed in this order on the inner wall of the memory hole 17. The third insulating film 35 is, for example, a silicon oxide film. The conductive film 130 is, for example, a polycrystalline silicon (polysilicon) film. A silicon oxide film, for example, is used in the first insulating film 31. The first insulating film 31, the conductive film 130 and the third insulating film 35 are formed using, for example, a CVD method or an ALD (Atomic Layer Deposition) method.

The channel body 20 is formed on the first insulating film 31. The channel body 20 is, for example, a polysilicon film. The channel body 20 is formed using, for example, a CVD method or an ALD method. Subsequently, the core 39 is formed, and a space inside the memory hole 17 is buried. The core 39 has insulating properties, and is, for example, a silicon oxide film.

Figure 4C:
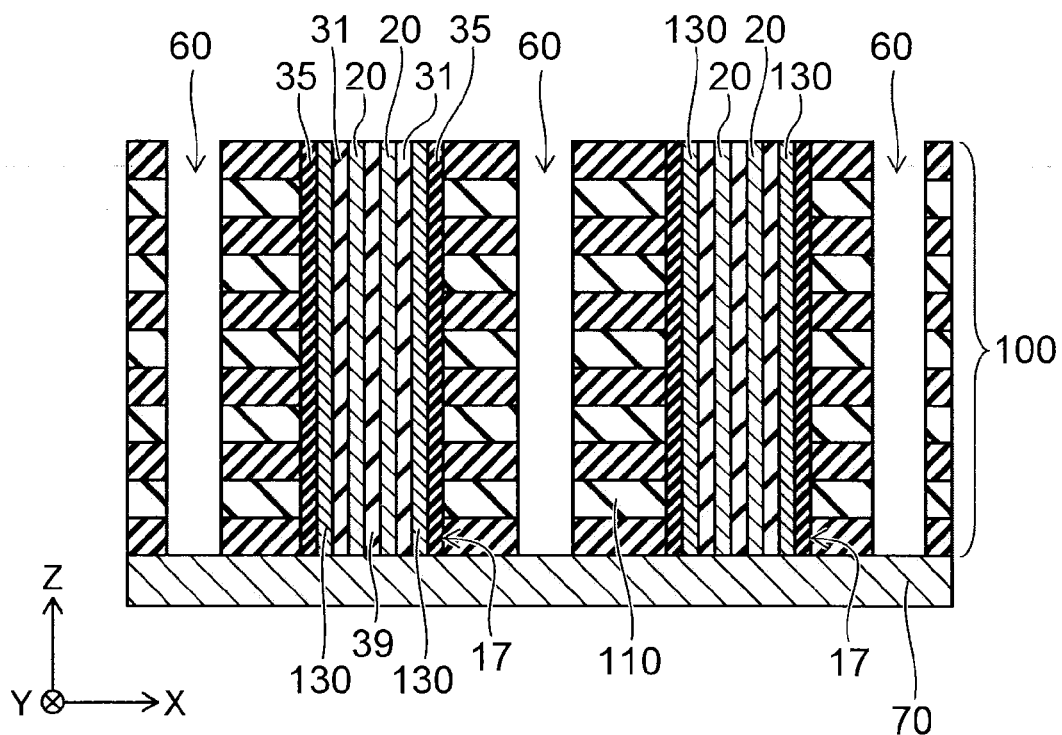

As shown in FIG. 4C, the slit 60 is formed. The slit 60 is a groove having a depth from the interlayer insulating film 15a to the source interconnection 70, and extends in the Y-direction. The slit 60 divides the stacked body 100 into a plurality of portions except the memory hole 17 of the stacked body 100. The slit 60 is formed by, for example, selectively etching the interlayer insulating film 15 and the sacrifice film 110 using RIE.

Figure 4D:
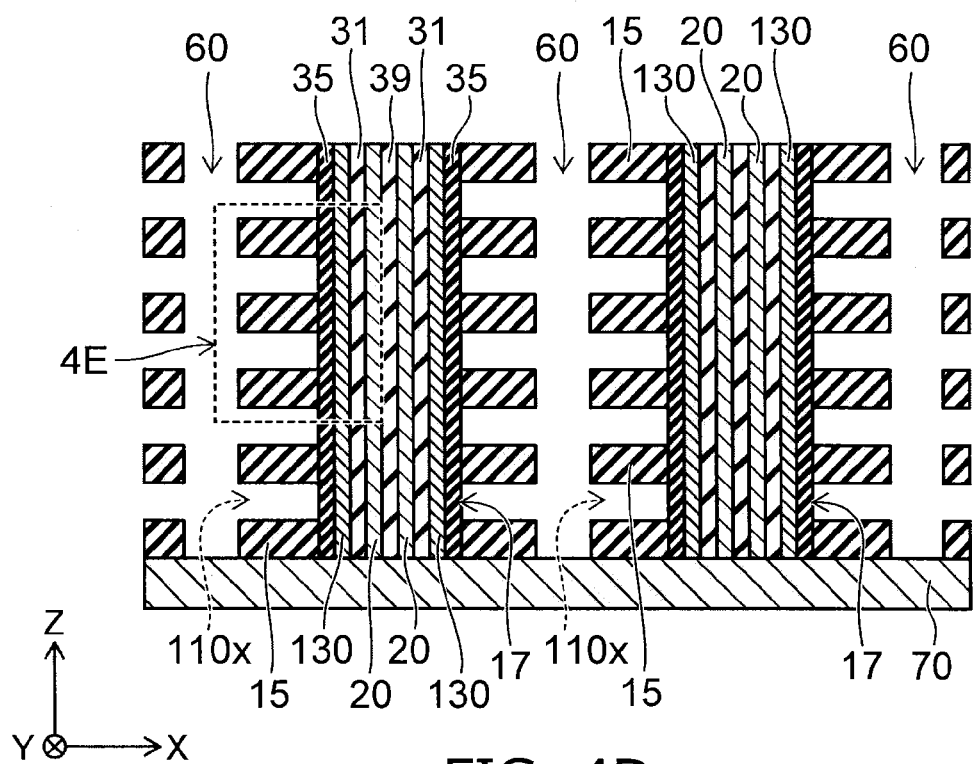

As shown in FIG. 4D, the sacrifice film 110 is selectively removed through the slit 60. For example, the interlayer insulating film 15 is a silicon oxide film, and the sacrifice film 110 is a silicon nitride film. In the inner wall of the memory hole 17, the third insulating film 35 that is in contact with the sacrifice film 110 is, for example, a silicon oxide film. The sacrifice film 110 can be selectively removed by, for example, wet etching using a hot phosphoric acid. The hot phosphoric acid is an etchant by which a silicon nitride film is etched and a silicon oxide film is not etched.

Hereinafter, processes of forming the control gate 10 and the conductive layer 30 will be described with reference to FIGS. 4E to 4L. FIGS. 4E to 4L are partially enlarged cross-sectional views showing a region 4E shown in FIG. 4D.

Figure 4E:
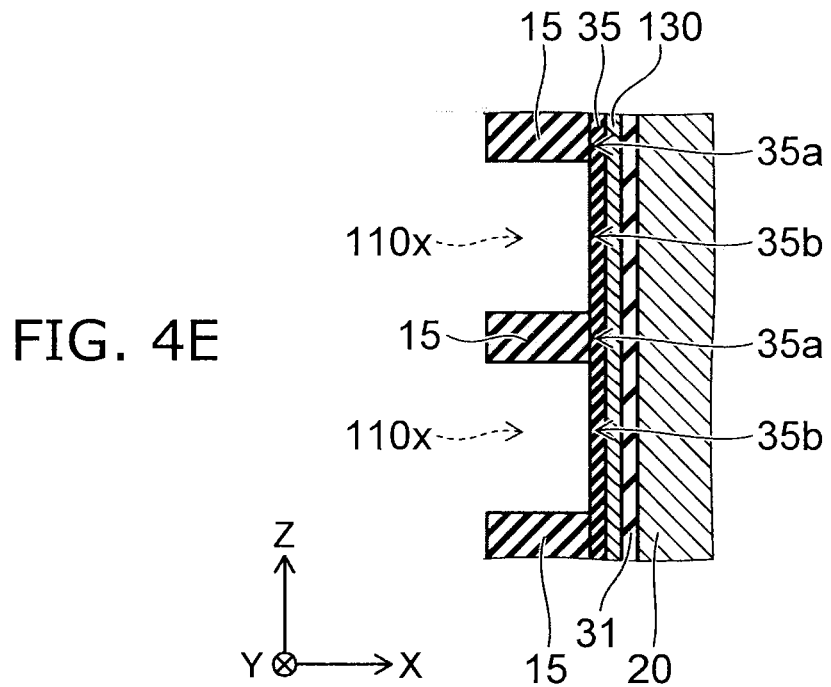

As shown in FIG. 4E, the interlayer insulating film 15 and the third insulating film 35 are exposed to a space 110x in which the sacrifice film 110 is removed. The third insulating film 35 includes a first portion 35a and a second portion 35b. The first portion 35a is located between the interlayer insulating film 15 and the first insulating film 31, and the second portion 35b is exposed to the space 110x.

Figure 4F:
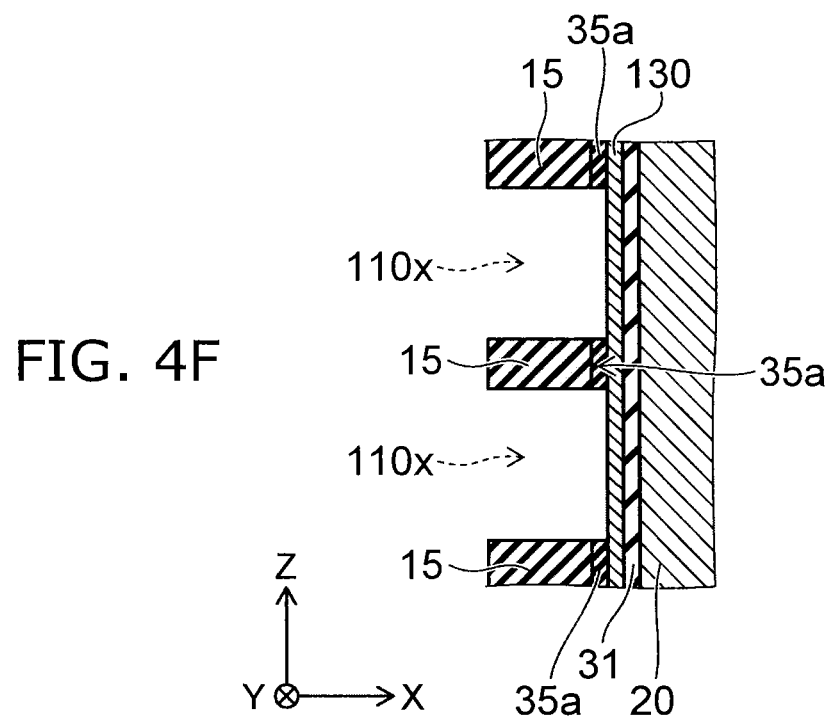

As shown in FIG. 4F, the second portion 35b exposed to the space 110x is etched, and the conductive film 130 is exposed. For example, the interlayer insulating film 15 and the third insulating film 35 are etched using an etching condition in which a silicon oxide film is etched and a polysilicon film is not etched. Thereby, the conductive film 130 can be exposed to the inside of the space 110x. The thickness of the third insulating film 35 in a direction perpendicular to the Z-direction is smaller than the thickness of the interlayer insulating film 15 in the Z-direction. Therefore, it is possible to leave the interlayer insulating film 15 behind, and to remove the second portion 35b of the third insulating film 35.

Figure 4G:
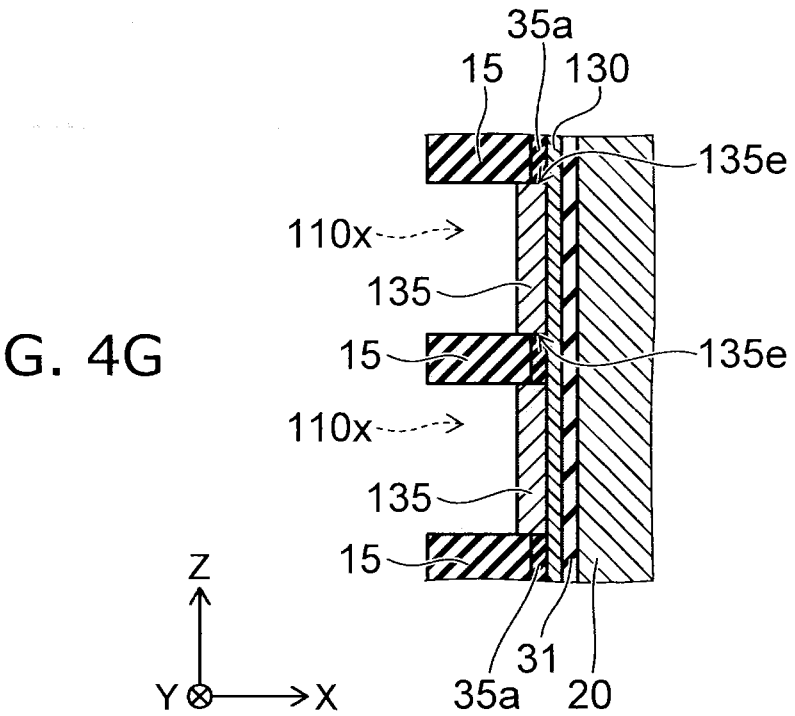

As shown in FIG. 4G, the second conductive film (hereinafter, conductive film 135) is selectively formed on the conductive film 130 exposed to the space 110x. The conductive film 135 is, for example, a silicon film which is epitaxially grown. A source gas for forming the conductive film 135 is supplied through the slit 60 and the space 110x. When the conductive film 130 is, for example, a polysilicon film, silicon can be selectively grown thereon. That is, a silicon film is not formed on the interlayer insulating film 15. The conductive film 135 is, for example, single crystal silicon or polysilicon.

Figure 4H:
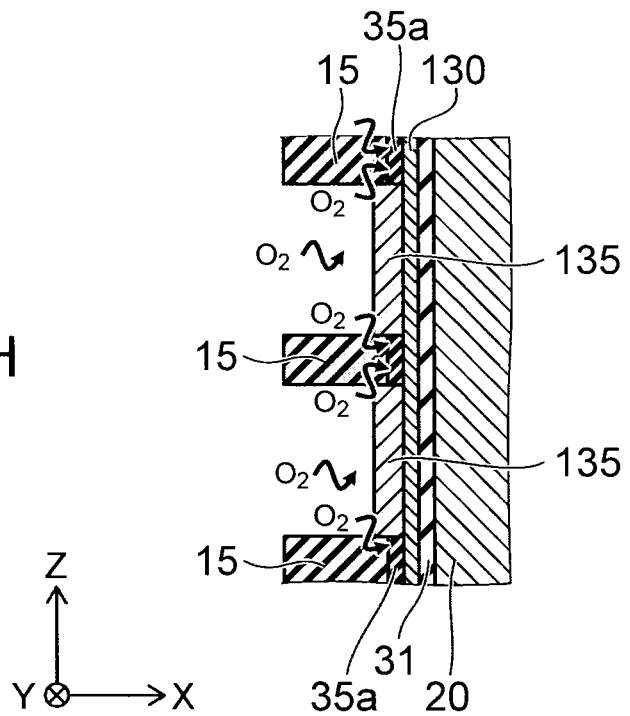

As shown in FIG. 4H, oxygen $O_2$ is supplied, and the conductive film 135 is oxidized. Oxygen $O_2$ is supplied through the slit 60 and the space 110x. The conductive film 135 is, for example, thermally oxidized. In addition, oxygen radicals $O^+$ obtained by ionizing oxygen atoms using plasma or the like may be supplied, and the conductive film 135 may be oxidized.

A silicon oxide film has a property of allowing the passage of oxygen therethrough. Therefore, when the silicon oxide film is used in the interlayer insulating film 15 and the third insulating film 35, oxygen passes through the interlayer insulating film 15 and the first portion 35a of the third insulating film 35, and reaches the conductive film 130. Thereby, it is possible to oxidize a portion of the conductive film 130 that is in contact with the first portion 35a, simultaneously with the conductive film 135.

Figure 4I:
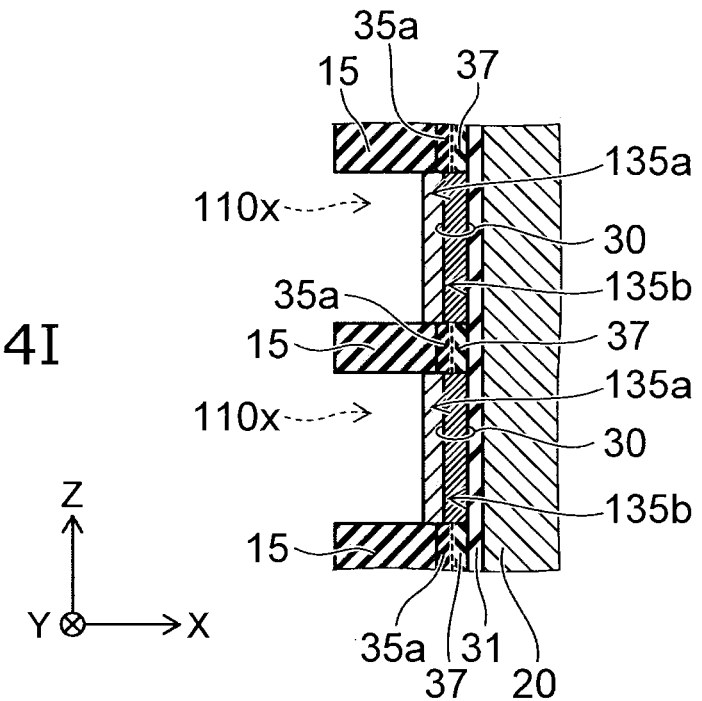

FIG. 4I shows a structure after the conductive films 130 and 135 are oxidized. A portion in which the conductive film 135 is oxidized serves as an oxidized layer 135a. The conductive layer 30 includes a remaining portion 135b of the conductive film 130. The oxidized layer 135a is, for example, a silicon oxide film.

The portion of the conductive film 130 oxidized between the first portion 35a of the third insulating film 35 and the first insulating film 31 serves as the fourth insulating film 37. The fourth insulating film 37 is, for example, a silicon oxide film.

A plurality of conductive layers 30 are formed by the above-mentioned oxidation. The conductive layer 30 includes a portion in which the conductive films 130 and 135 are not oxidized. The plurality of conductive layers 30 are formed so as to be separated from each other in the Z-direction through the first portion 35a of the third insulating film 35 and the fourth insulating film 37.

In this example, an example is illustrated in which the conductive film 130 which is a silicon layer and the conductive film 135 which is a polysilicon film are oxidized, but the embodiment is not limited thereto. For example, the conductive films 130 and 135 may be nitrided by supplying nitrogen radicals $N^+$ instead of oxygen.

Figure 4J:
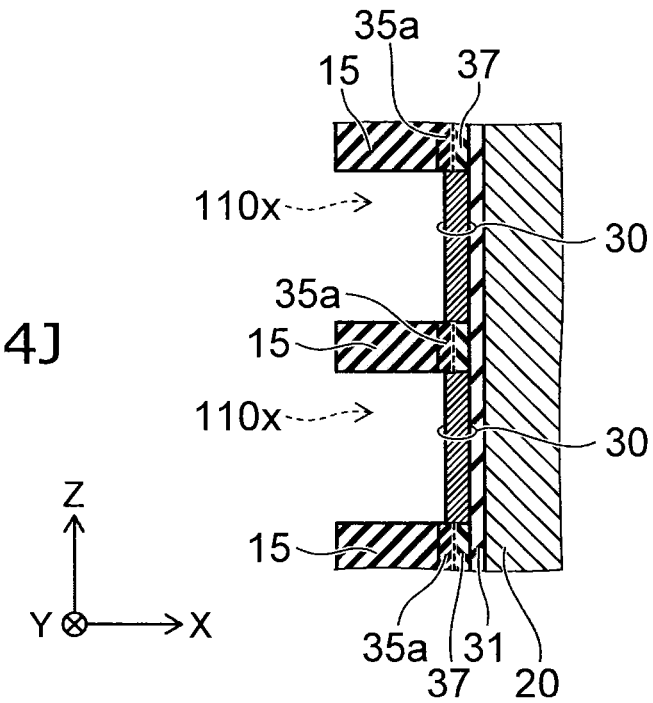

FIG. 4J shows a structure after the oxidized layer 135a is removed and the conductive layer 30 is exposed to the space 110x. For example, a silicon oxide film is etched through the slit 60 and the space 110x.

Figure 4K:
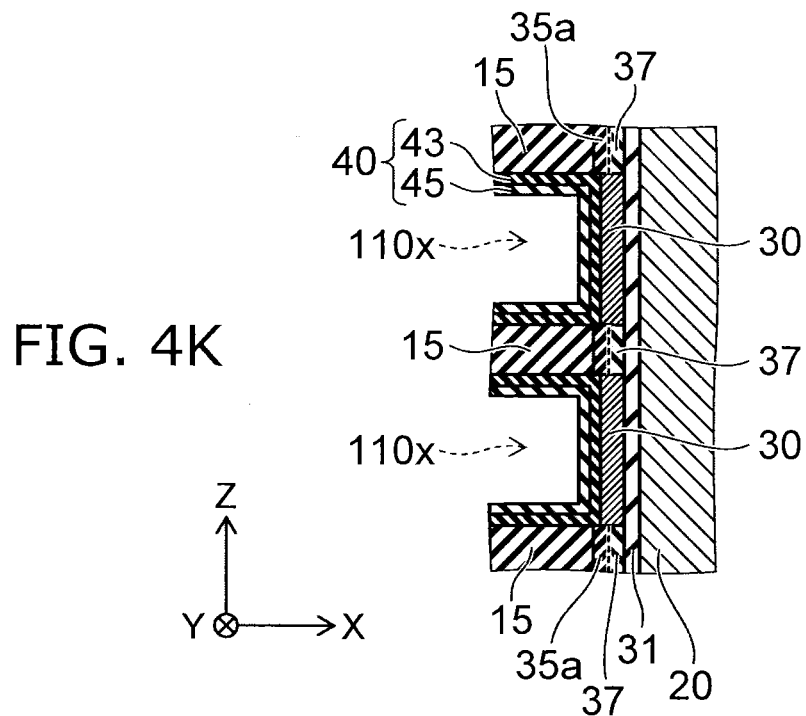

As shown in FIG. 4K, the first film 43 and the second film 45 are formed inside the space 110x. The first film 43 covers the interlayer insulating film 15 and the conductive layer 30. A silicon nitride film, for example, is used in the first film 43. In addition, a film including a metal oxide such as an aluminum oxide ($Al_2O_3$) or a hafnium oxide ($HfO_x$), a so-called High-k film may be used. The second film 45 is a film having a dielectric constant lower than that of the first film 43. The second film 45 is, for example, a silicon oxide film. The first film 43 and the second film 45 are formed using, for example, an ALD method.

Figure 4L:
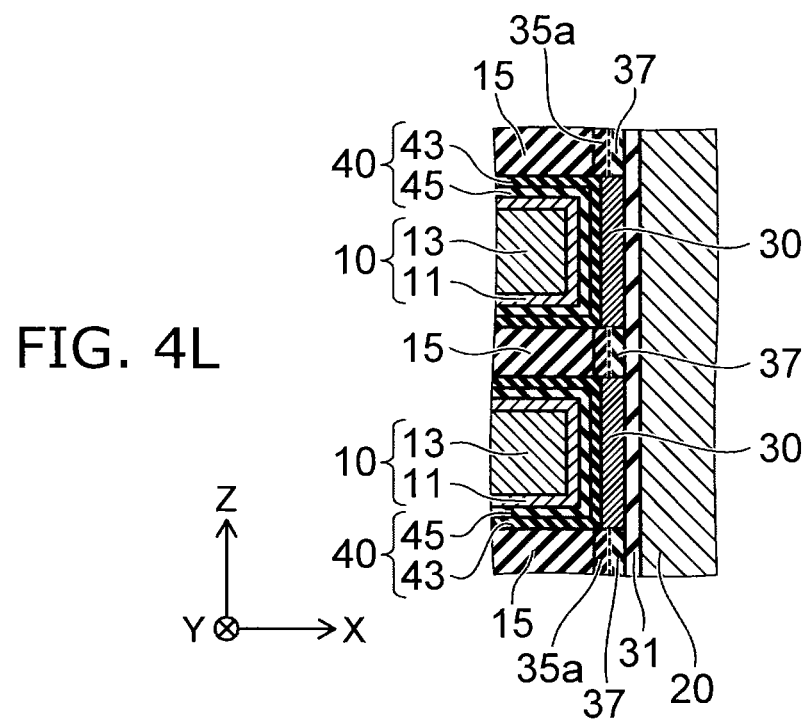

FIG. 4L shows a structure in which the control gate 10 is formed inside the space 110x. The control gate 10 includes, for example, the first electrode layer 11 and the second electrode layer 13. The first electrode layer 11 is formed on the second film 45, and the second electrode layer 13 is formed on the first electrode layer 11. The second electrode layer 13 buries the inside of the space 110x. The first electrode layer 11 is, for example, a titanium nitride (TiN). The first electrode layer 11 functions as a barrier metal for suppressing the transfer of metal atoms from the second electrode layer 13 to the memory cell MC1. The second electrode layer 13 is, for example, tungsten (W).

In the embodiment, after the processes shown in FIGS. 4A to 4L, the insulating film 61 that buries the inside of the slit 60 is formed. Further, the selection transistor 50 and the bit line 80 are formed, and the non-volatile memory device 1 is completed. The embodiment is not limited to this example. For example, in the process of forming the stacked body 100 shown in FIG. 4A, a portion constituting the selection transistor 50 may be further stacked.

In the above-mentioned manufacturing process, oxygen $O_2$ is supplied through the space 110x in which the sacrifice film 110 is removed. Therefore, at an end 135e (see FIG. 4E) of the conductive film 135 in the Z-direction or a direction opposite thereto, an oxidation rate in the corner on the space 110x side increases. For this reason, the conductive layer 30 formed by oxidation has a shape in which the thickness $d_{CS}$ in a direction perpendicular to the Z-direction becomes smaller as the thickness approaches the end 30e. In addition, the conductive layer 30 is formed so as to have a convex shape in the direction of the space 110x.

Figure 5A:
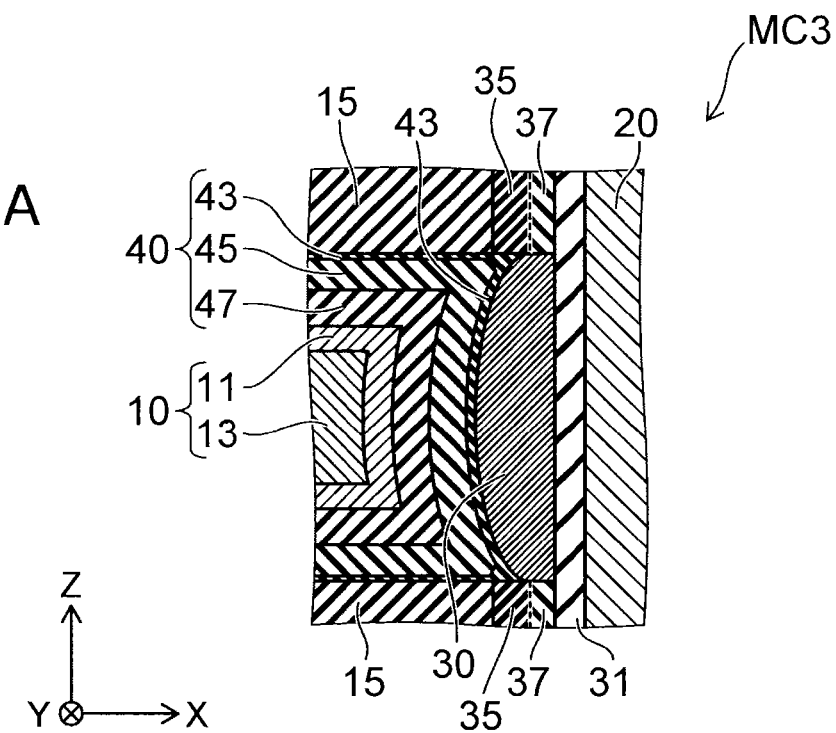
FIGS. 5A and 5B are schematic views illustrating structures of memory cells according to a variation of the first embodiment.
Figure 5B:
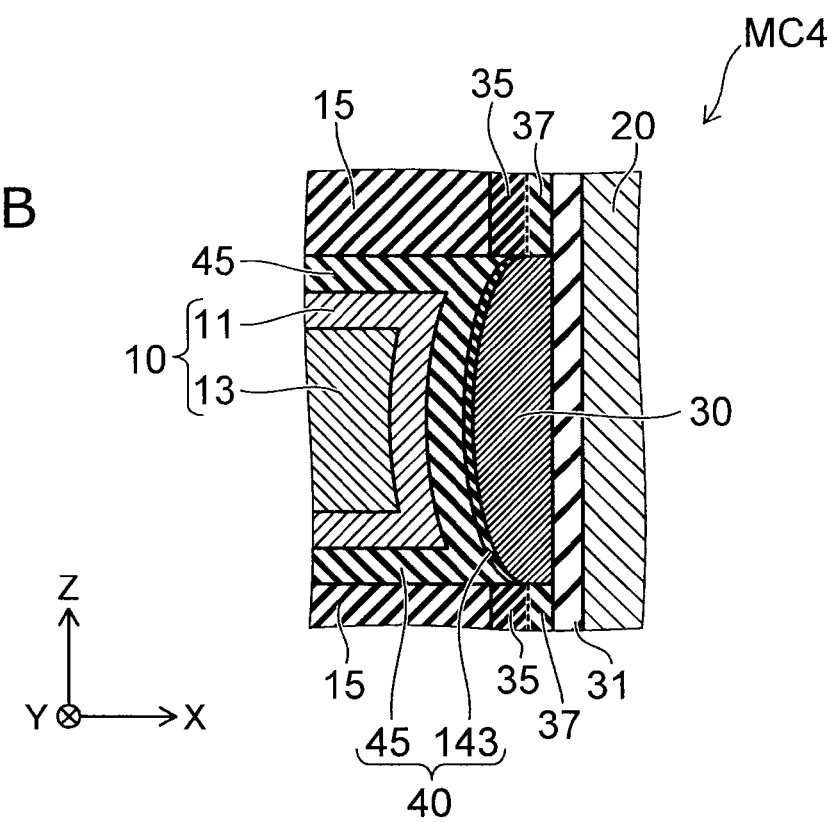

FIGS. 5A and 5B are schematic views illustrating structures of memory cells according to a variation of the first embodiment.

A memory cell MC3 shown in FIG. 5A includes a third film 47 between the control gate 10 and the second film 45, in addition to the structure of the memory cell MC1 shown in FIG. 2B. That is, the second insulating film 40 of the memory cell MC3 includes the first film 43, the second film 45, and the third film 47. The third film 47 has a dielectric constant higher than that of the second film 45. The third film 47 includes a metal oxide such as, for example, an aluminum oxide. In addition, the third film 47 may be a silicon nitride film. Thereby, it is possible to alleviate an electric field between the control gate 10 and the second film 45, and to improve a dielectric breakdown voltage of the second insulating film 40.

A memory cell MC4 shown in FIG. 5B is provided with the second insulating film 40 including a first film 143 and the second film 45. The first film 143 is provided between the conductive layer 30 and the second film 45. The first film 143 does not include the portion (second portion 43b of FIG. 2B) extending between the interlayer insulating film 15 and the second film 45.

The dielectric constant of the first film 143 is higher than the dielectric constant of the second film 45. The first film 143 is, for example, a silicon nitride film. The first film 143 can be formed by supplying nitrogen to the space 110x and thermally nitriding a portion of the conductive layer 30, for example, in the process shown in FIG. 4J. In addition, nitrogen radicals ($N^+$) may be supplied through the space 110x, and plasma nitridation may be performed. Thereby, during data writing, it is possible to alleviate an electric field between the conductive layer 30 and the second film 45, and to suppress a gate leakage current.

The first film 143 may be, for example, a silicon oxynitride film. For example, in the process shown in FIG. 4I, the oxidized layer 135a is nitrided by supplying nitrous oxide (NO)

to the space 110x and applying heat treatment. Thereby, a silicon oxynitride film can be formed as the first film 143. Subsequently, the second film 45 is formed on the first film 143.

As stated above, the non-volatile memory device 1 according to the embodiment includes the conductive layers 30 which are separated from each other in the Z-direction. The conductive layer 30 becomes smaller in a thickness $d_{CS}$ in a direction perpendicular to the Z-direction as the conductive layer is closer to the end 30e in the Z-direction or a direction opposite thereto, and has a convex shape in a direction from the channel body 20 toward the control gate 10. Further, the width $W_{EL}$ of the control gate 10 in the Z-direction is provided to be smaller than the width $W_{CS}$ of the conductive layer 30 in the Z-direction. Thereby, in the memory cells MC1, MC3 and MC4, it is possible to increase the amount of charge stored, and to improve data holding characteristics. In addition, the shape of the conductive layer 30 increases a coupling ratio between the control gate 10 and the memory cells MC1 and MC3, and reduces a voltage during data writing and erasure. Thereby, it is possible to improve the reliability of the memory cell.

Further, in the memory cells MC1, MC3, and MC4, the second insulating film 40 includes the first film 43 (143) and the second film 45. The first film 43 (143) has a dielectric constant higher than that of the second film 45, and thus can suppress a gate leakage current during data writing. Thereby, it is possible to improve the reliability of the memory cell.

Second Embodiment

Figure 6:
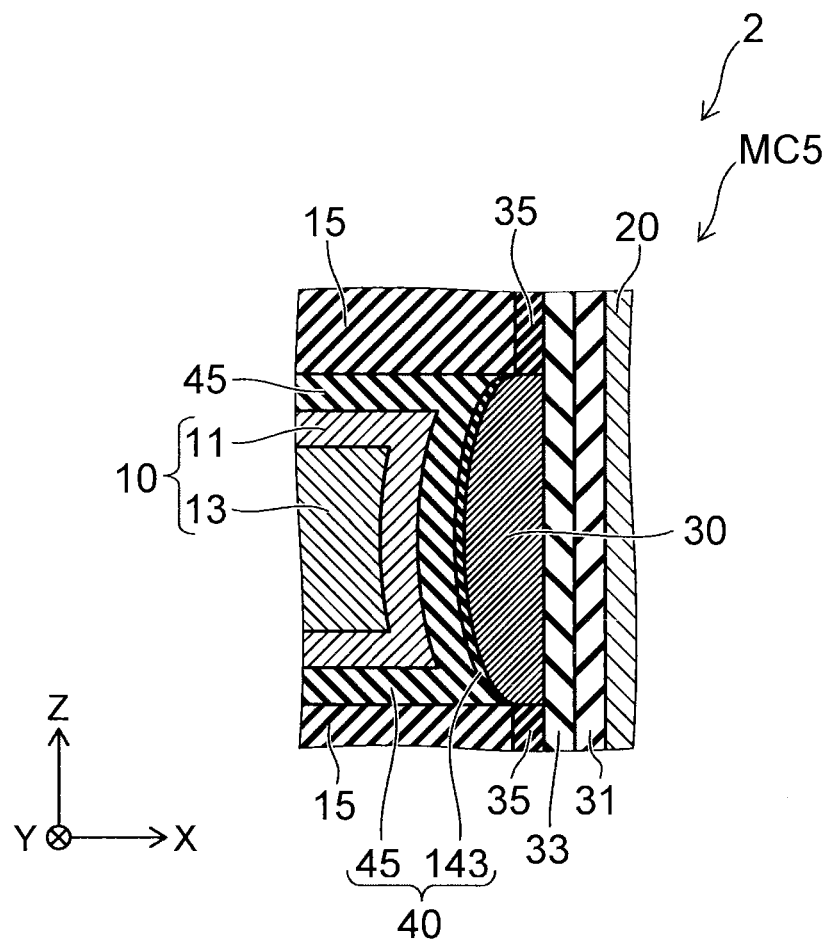
FIG. 6 is a schematic cross-sectional view illustrating a non-volatile memory device according to a second embodiment.

FIG. 6 is a schematic cross-sectional view illustrating a non-volatile memory device 2 according to a second embodiment. The non-volatile memory device 2 includes a memory cell MC5.

As shown in FIG. 6, the memory cell MC5 includes the conductive layer 30, the first insulating film 31, the second insulating film 40, and a fifth insulating film 33 between the control gate 10 and the channel body 20.

The second insulating film 40 includes the first film 143 and the second film 45. The first film 143 is provided between the conductive layer 30 and the second film 45. The first film 143 does not include, for example, the portion (second portion 43b of FIG. 2B) extending between the interlayer insulating film 15 and the second film 45. The dielectric constant of the first film 143 is higher than the dielectric constant of the second film 45.

The fifth insulating film 33 is provided between the conductive layer 30 and the first insulating film 31. The energy bandgap of the fifth insulating film 33 is smaller than the energy bandgap of the first insulating film 31. The fifth insulating film 33 extends in the Z-direction along the first insulating film 31, and is in contact with, for example, the conductive layer 30.

Next, a method of manufacturing the non-volatile memory device 2 according to the second embodiment will be described with reference to FIGS. 7A to 7F. FIGS. 7A to 7F are schematic cross-sectional views illustrating processes of manufacturing the non-volatile memory device 2.

Figure 7A:
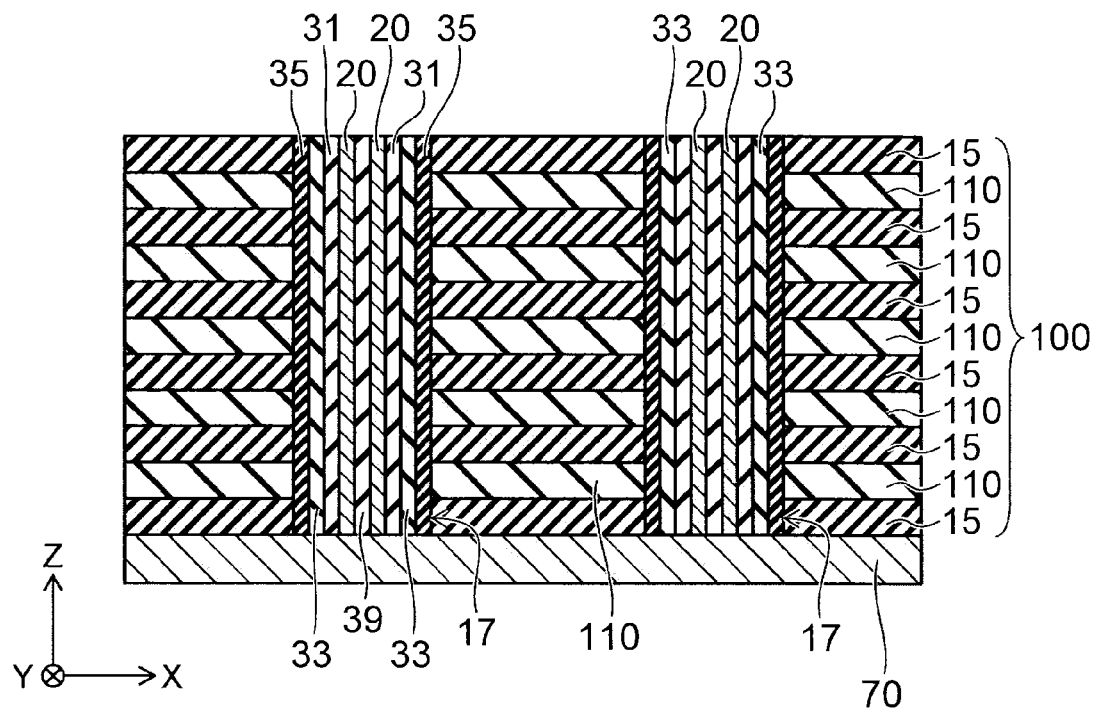
FIGS. 7A to 7F are schematic cross-sectional views illustrating processes of manufacturing the non-volatile memory device according to the second embodiment.

As shown in FIG. 7A, the memory hole 17 passing through the stacked body 100 in the Z-direction is formed. The channel body 20, the first insulating film 31, the third insulating film 35, and the fifth insulating film 33 are formed in the inside thereof.

The third insulating film 35, the fifth insulating film 33 and the first insulating film 31 are formed in this order on the inner wall of the memory hole 17. The fifth insulating film 33 is, for example, a silicon nitride film. The first insulating film 31 is, for example, a silicon oxide film.

Figure 7B:
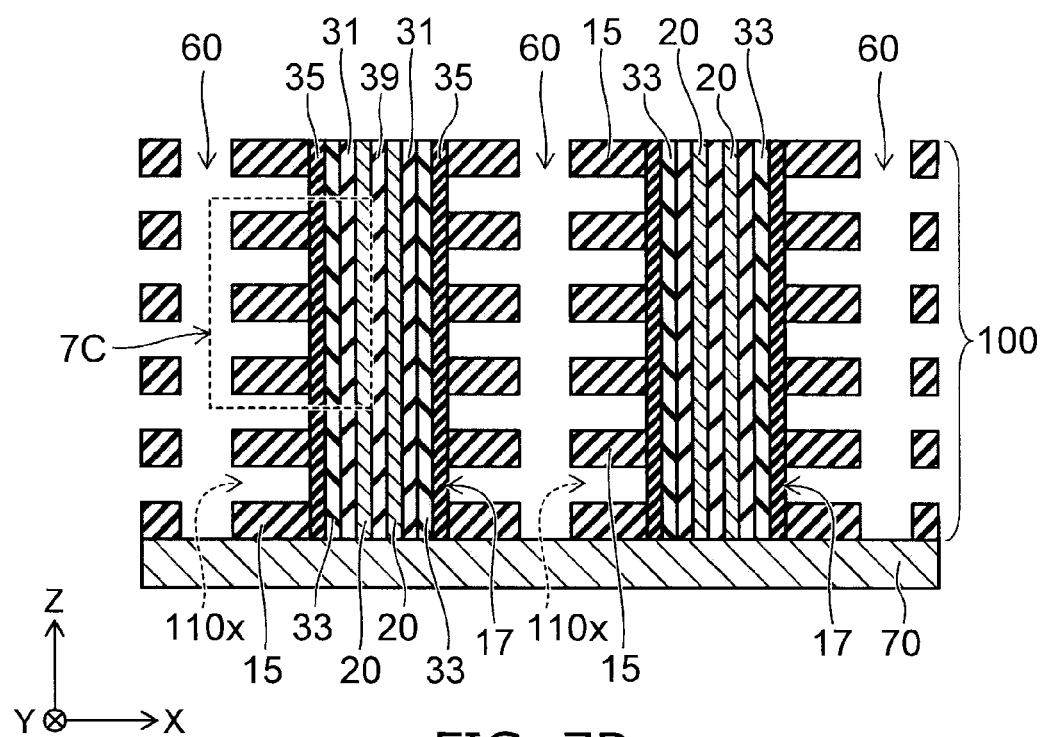

As shown in FIG. 7B, the sacrifice film 110 is selectively removed through the slit 60. The slit 60 is a groove having a depth from the interlayer insulating film 15a to the source interconnection 70, and extends in the Y-direction. The sacrifice film 110 can be selectively removed by, for example, wet etching using a hot phosphoric acid by which a silicon nitride film is etched and a silicon oxide film is not etched. The interlayer insulating film 15 and the third insulating film 35 are exposed to the space 110x in which the sacrifice film 110 is removed.

Figure 7C:
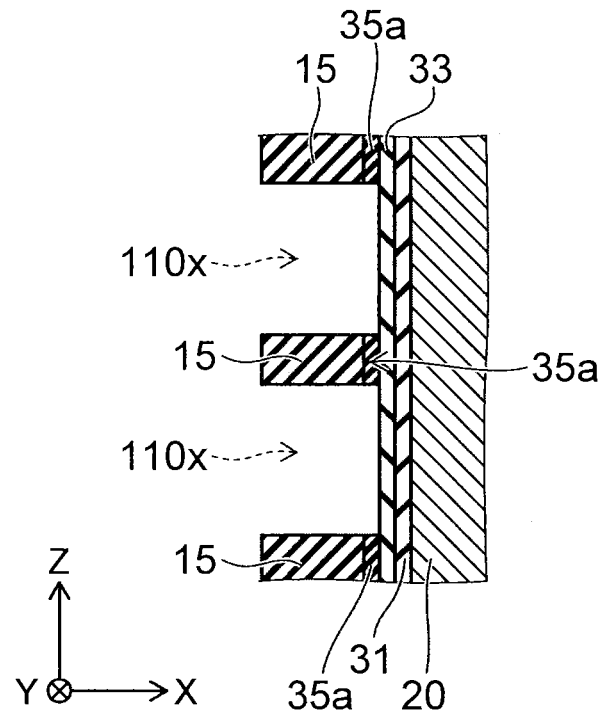

FIG. 7C is a partially enlarged cross-sectional view showing a region 7C shown in FIG. 7B.

As shown in FIG. 7C, the third insulating film 35 exposed to the space 110x is etched, and the fifth insulating film 33 is exposed. For example, the third insulating film 35 is etched using an etching condition in which a silicon oxide film is etched and a silicon nitride film is not etched. Thereby, the fifth insulating film 33 can be exposed to the inside of the space 110x. The portion 35a in which the third insulating film 35 is not etched remains between the interlayer insulating film 15 and the fifth insulating film 33.

Figure 7D:
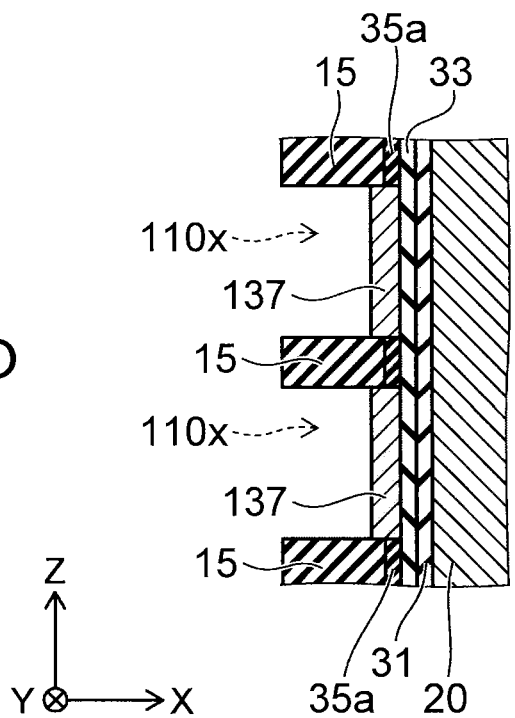

As shown in FIG. 7D, a conductive film 137 is selectively formed on the fifth insulating film 33 exposed to the space 110x. The conductive film 137 is, for example, a silicon film which is epitaxially grown. A source gas for forming the conductive film 137 is supplied through the slit 60 and the space 110x.

When the fifth insulating film 33 is, for example, a silicon nitride film, a silicon core can be selectively formed on the fifth insulating film 33 using a CVD method. That is, in a deposition process of silicon using a CVD method, silicon can be selectively deposited on a silicon nitride film during a so-called incubation time.

Subsequently, the forming conditions of silicon are changed from a CVD mode to an epitaxial mode. Thereby, it is possible to form the conductive film 137 using the silicon core formed on the fifth insulating film 33 as a base.

The term "CVD mode" as used herein refers to, for example, a condition in which an amorphous silicon film or a polysilicon film can be deposited without depending on a base. The term "epitaxial mode" as used herein refers to, for example, a condition in which silicon crystal is grown depending on the crystal of a base. In the epitaxial mode, it is possible to selectively perform crystal growth on silicon. The silicon film formed in the epitaxial mode is, for example, a single crystal silicon or polysilicon.

Figure 7E:
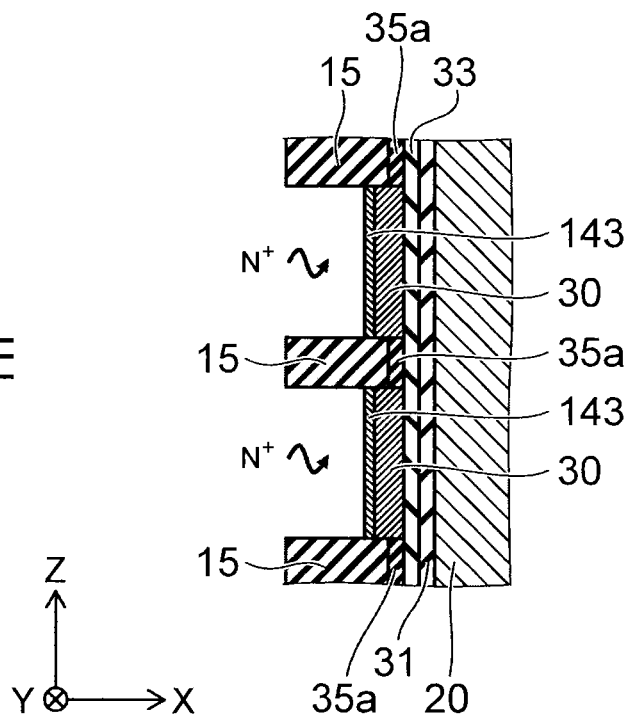

As shown in FIG. 7E, nitrogen is supplied through the slit 60 and the space 110x, and the conductive film 137 is thermally nitrided. Thereby, it is possible to form the first film 143 in which the conductive film 137 is nitrided and the conductive layer 30 which is a portion in which the conductive film 137 is not nitrided. In addition, nitrogen radicals ($N^+$) may be supplied through the space 110x, and plasma nitridation may be performed on the conductive film 137.

Figure 7F:
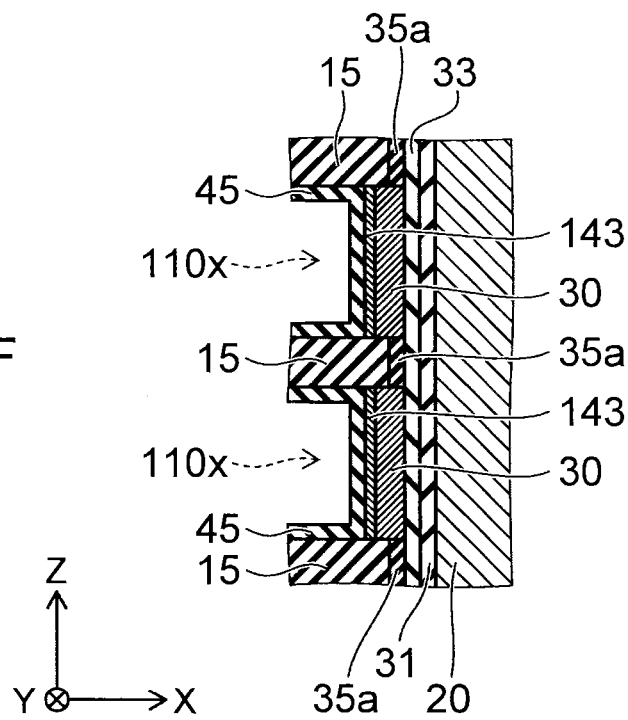

As shown in FIG. 7F, the second film 45 is formed inside the space 110x. The second film 45 is, for example, a silicon oxide film. The second film 45 is formed on the first film 43 and the interlayer insulating film 15. Subsequently, the control gate 10 for burying the space 110x is formed.

As described above, in the embodiment, the conductive film 137 is selectively formed on the fifth insulating film 33. Therefore, the conductive layers 30 are formed to be separated from each other in the Z-direction. Therefore, it is possible to omit, for example, the process of oxidizing the conductive film 135 shown in FIG. 4H and the process of removing the oxide.

In addition, in the process of FIG. 7E, the first film 43 may be formed using, for example, an ALD method instead of the nitridation of the conductive film 137. In that case, the first film 43 covers the conductive film 137 serving as the conductive layer 30, and the interlayer insulating film 15.

The first film 143 may be, for example, a silicon oxynitride film. For example, in the process of FIG. 7D, a silicon oxide film that covers the conductive film 137 and the interlayer insulating film 15 is formed. Subsequently, a silicon oxide film is nitrided by supplying nitrous oxide (NO) to the space 110x and applying heat treatment. Thereby, a silicon oxynitride film can be formed as the first film 143.

Third Embodiment

Figure 8A:
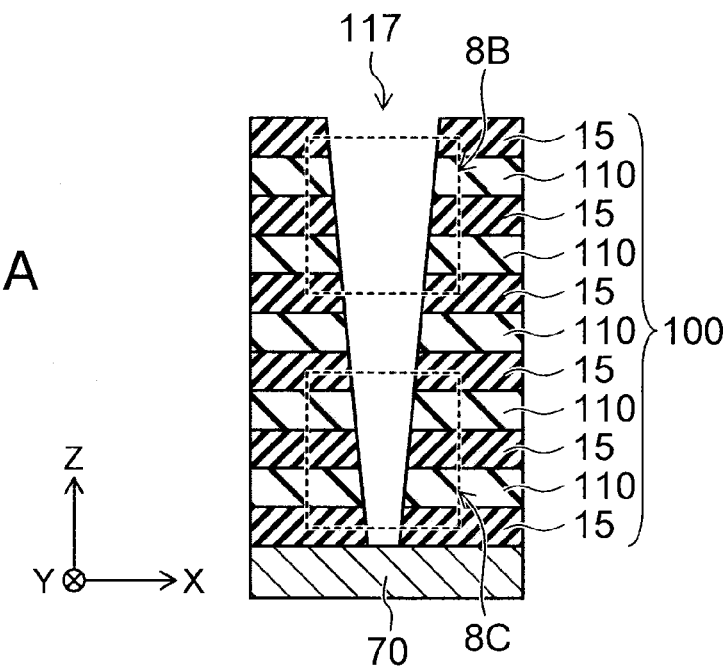
FIGS. 8A to 8C are schematic views illustrating a non-volatile memory device according to a third embodiment.
Figure 8B:
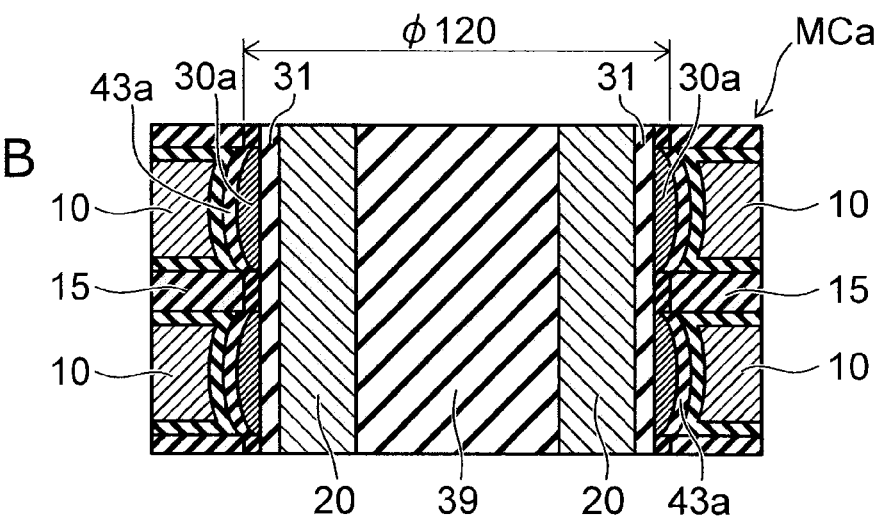
Figure 8C:
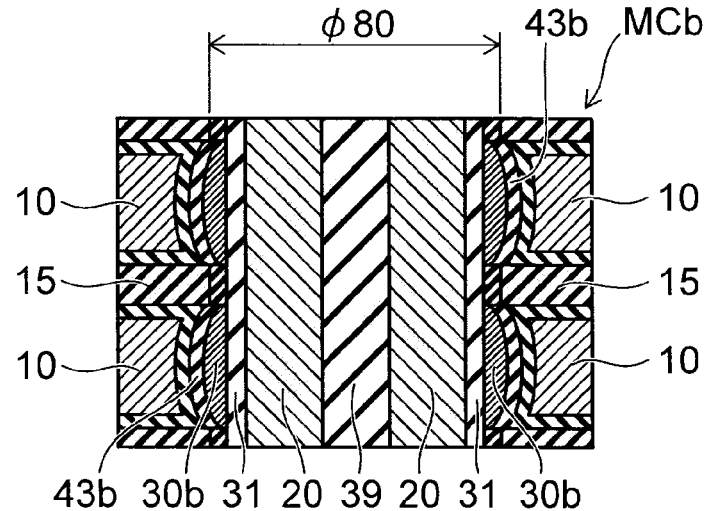

FIGS. 8A to 8C are schematic views illustrating a non-volatile memory device 3 according to a third embodiment. FIG. 8A is a schematic cross-sectional view illustrating a shape of a memory hole 117 of the non-volatile memory device 3. FIG. 8B is a partial cross-sectional view illustrating a first memory cell (hereinafter, memory cell MCa) which is provided in a region 8B shown in FIG. 8A. FIG. 8C is a partial cross-sectional view illustrating a second memory cell (hereinafter, memory cell MCb) which is provided in a region 8C shown in FIG. 8A.

As shown in FIG. 8A, the memory hole 117 is configured such that its diameter in a direction perpendicular to the Z-direction is smaller at the source interconnection 70 side. For example, when the stacked body 100 is etched using RIE to form the memory hole 117, there is a tendency for the diameter to decrease in a depth direction.

As shown in FIG. 8B, the memory cell MCa includes a first conductive layer (hereinafter, conductive layer 30a). In addition, as shown in FIG. 8C, the memory cell MCb includes a second conductive layer (hereinafter, conductive layer 30b). The diameter of the conductive layer 30a in a direction perpendicular to the Z-direction is larger than the diameter of the conductive layer 30b in a direction perpendicular to the Z-direction.

For example, even when the same control voltage is applied between the control gate 10 and the channel body 20, in the memory cell MCb provided in the region 8C, the electric field of the tunnel insulating film (that is, first insulating film 31) becomes higher than the electric field of the tunnel insulating film of the memory cell MCa provided in the region 8B, due to a curvature effect. As a result, for example, a minimum voltage for writing data in the memory cell MCa becomes higher than a minimum voltage for writing data in the memory cell MCb. For example, when the writing voltage of the non-volatile memory device 3 is set to a level at which data is written in the memory cell MCa, an excessive voltage is applied to the memory cell MCb.

On the other hand, in the embodiment, the coupling ratio of the memory cell MCb is made to be smaller than the coupling ratio of the memory cell MCa. Thereby, it is possible to reduce the electric field of the tunnel insulating film of the memory cell MCb, and to make the writing voltage uniform.

Specifically, in the process of forming the conductive film 135 shown in FIG. 4G, for example, the pressure of epitaxial growth is made to be higher, and thus the conductive film 135 located above the memory hole 117 is formed to be thicker than the conductive film 135 located below the memory hole 117. In the oxidation process shown in FIG. 4H, as the conductive film 135 is thicker, the oxidation of the end progresses more rapidly due to the shape effect. For this reason, at the upper portion side of the memory hole 117, the conductive layer 30 has a shape in which the area of a surface facing the control gate 10 is larger than at the lower portion side. As a result, the coupling ratio of the memory cell MCa can be made to be higher than the coupling ratio of the memory cell MCb.

Further, in the process of forming the first film 43, the film thickness of the portion 43a formed at the upper portion of the memory hole 117 is also formed so as to be larger than the film thickness of the portion 43b formed at the lower portion of the memory hole 117. Thereby, at the upper portion of the memory hole 117, it is possible to further alleviate the electric field of the first film 43. As a result, at the upper portion of the memory hole 117, it is possible to suppress an increase in a gate leakage current due to the coupling ratio being increased.

In this manner, in the embodiment, the coupling ratio of the memory cell MCa provided at the upper portion of the memory hole 117 is made to be higher than the coupling ratio of the memory cell MCb provided at the lower portion thereof, and thus it is possible to improve the non-uniformity of a writing voltage (or erasing voltage), and to improve the reliability of the non-volatile memory device 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A non-volatile memory device comprising:
a plurality of electrodes arranged side by side in a first direction;
at least one semiconductor layer extending into the electrodes in the first direction;
conductive layers provided between each of the electrodes and the semiconductor layer, the conductive layers being separated from each other in the first direction;
a first insulating film extending between the conductive layers and the semiconductor layer in the first direction along the semiconductor layer; and
a second insulating film provided between each of the electrodes and the conductive layers,
the conductive layers becoming smaller in a thickness in a direction perpendicular to the first direction as the conductive layers are closer to an end of each of the conductive layers in the first direction or a direction opposite to the first direction, and having a convex shape in a direction from the semiconductor layer toward each of the electrodes,
the second insulating film including a first film in contact with the conductive layers, and a second film provided between each of the electrodes and the first film, and
a dielectric constant of the first film being higher than a dielectric constant of the second film.

2. The device according to claim 1, wherein the first film includes a nitride of elements constituting the conductive layers.

3. The device according to claim 1, wherein the first film is a silicon nitride film.

4. The device according to claim 1, wherein the first film includes a metal oxide.

5. The device according to claim 1, further comprising a plurality of interlayer insulating films respectively provided between the electrodes, the first film extending between each of the electrodes and the interlayer insulating films adjacent to each of the electrodes.

6. The device according to claim 5, wherein the first film has a maximum thickness between a portion in contact with the conductive layers and a portion extending between each of the electrodes and the interlayer insulating films.

7. The device according to claim 1, wherein the second insulating film further includes a third film having a dielectric constant higher than a dielectric constant of the second film between each of the electrodes and the second film.

8. The device according to claim 7, wherein
the first film is a silicon nitride film,
the second film is a silicon oxide film, and
the third film includes a metal oxide.

9. The device according to claim 1, further comprising:
a plurality of interlayer insulating films respectively provided between the electrodes; and
a third insulating film provided between the interlayer insulating films and the first insulating film.

10. The device according to claim 9, further comprising a fourth insulating film provided between the first insulating film and the third insulating film, the fourth insulating film including an oxide of elements constituting the conductive layers.

11. The device according to claim 10, wherein
the conductive layers are a silicon layer, and
the fourth insulating film is a silicon oxide film.

12. The device according to claim 1, wherein a width of the conductive layers in the first direction is larger than a width of each of the electrodes in the first direction.

13. The device according to claim 1, further comprising a fifth insulating film provided between the conductive layers and the first insulating film,
an energy bandgap of the fifth insulating film being smaller than an energy bandgap of the first insulating film.

14. The device according to claim 13, wherein
the first insulating film is a silicon oxide film, and
the fifth insulating film is a silicon nitride film.

15. The device according to claim 1, further comprising:
a first memory cell including a first conductive layer provided between an end electrode of the electrodes and the semiconductor layer; and
a second memory cell including a second conductive layer provided between another end electrode of the electrodes and the semiconductor layer,
a diameter of a cross-section of the first conductive layer perpendicular to the first direction being larger than a diameter of a cross-section of the second conductive layer perpendicular to the first direction, and
a coupling ratio of the first memory cell being larger than a coupling ratio of the second memory cell.

16. The device according to claim 15, wherein a first film in contact with the first conductive layer is thicker than a first film in contact with the second conductive layer.

* * * * *